(12) United States Patent
Yao et al.

(10) Patent No.: US 11,533,049 B2
(45) Date of Patent: Dec. 20, 2022

(54) PRE-CHARGE TECHNIQUES FOR A MULTI-LEVEL FLYING CAPACITOR CONVERTER

(71) Applicant: Texas Instruments Incorporated, Dallas, TX (US)

(72) Inventors: Tong Yao, San Jose, CA (US); Johan Tjeerd Strydom, Saratoga, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/363,630

(22) Filed: Jun. 30, 2021

(65) Prior Publication Data
US 2022/0060183 A1 Feb. 24, 2022

Related U.S. Application Data (60) Provisional application No. 63/067,680, filed on Aug. 19, 2020.

(51) Int. Cl.
| | | |
|---|---|---|
| *H02M 1/08* | (2006.01) | |
| *H03K 5/156* | (2006.01) | |
| *H02M 3/158* | (2006.01) | |
| *H02M 1/00* | (2006.01) | |

(52) U.S. Cl.
CPC ........ *H03K 5/1565* (2013.01); *H02M 1/0095* (2021.05); *H02M 1/08* (2013.01); *H02M 3/158* (2013.01)

(58) Field of Classification Search
None
See application file for complete search history.

(56) References Cited

U.S. PATENT DOCUMENTS

| | | | | |
|---|---|---|---|---|
| 6,353,547 B1* | 3/2002 | Jang | ..................... | H02M 7/487 |
| | | | | 363/16 |
| 10,075,080 B1* | 9/2018 | Scoones | ............... | H02M 3/1588 |
| 10,693,373 B2* | 6/2020 | Li | ........................ | H02M 7/4837 |
| 10,784,777 B2* | 9/2020 | Ramadass | ............... | H02M 1/00 |

OTHER PUBLICATIONS

Thielemans, S. et al. "Self-Precharge in Single-Leg Flying Capacitor Converters." 2009 35th Annual Conference of IEEE Industrial Electronics, Porto, 2009, pp. 821-817. doi:10.1109/IECON.2009.5415024 (6 pages).

* cited by examiner

*Primary Examiner* — Jeffery S Zweizig
(74) *Attorney, Agent, or Firm* — Michael A. Davis, Jr.; Frank D. Cimino (57) ABSTRACT

A circuit includes first and second transistors, a capacitor, and a controller. The controller is coupled to the control inputs of the first and second transistors. The controller configured to, during a first mode and in accordance with a first time-varying duty cycle, turn on and off the first transistor while turning on the second transistor when the first transistor is off. The controller is also configured to, during a second mode following the first mode, and in accordance with a second time-varying duty cycle, turn on and off the first transistor while turning on the second transistor when the first transistor is off.

20 Claims, 8 Drawing Sheets

PRE-CHARGE TECHNIQUES FOR A MULTI-LEVEL FLYING CAPACITOR CONVERTER

CROSS-REFERENCE TO RELATED APPLICATIONS

This application claims priority to U.S. Provisional Application No. 63/067,680, filed Aug. 19, 2020, which is hereby incorporated by reference.

BACKGROUND

One type of an alternating current (AC) to direct current (DC) converter is a flying capacitor, multilevel converter. A flying capacitor, multilevel converter uses capacitors, called flying capacitors, to clamp the voltage across transistors. These types of converters are beneficial for high power and high voltage operation at low distortion.

SUMMARY

In accordance with an example, a circuit includes first and second transistors, a capacitor, and a controller. The controller is coupled to the control inputs of the first and second transistors. The controller configured to, during a first mode and in accordance with a first time-varying duty cycle, turn on and off the first transistor while turning on the second transistor when the first transistor is off. The controller is also configured to, during a second mode following the first mode, and in accordance with a second time-varying duty cycle, turn on and off the first transistor while turning on the second transistor when the first transistor is off.

DETAILED DESCRIPTION

The embodiments described herein are directed to a start-up mode to pre-charge the capacitors for a flying capacitor, multilevel converter in a controlled manner. During the start-up mode, a controller controls the on and off state of the converter's transistors according to a first time-varying duty cycle control technique. Following the start-up mode, the converter enters its normal (steady state operation) in which the controller controls the on and off state of the transistors according to a second time-varying duty cycle control technique. The figures presented herein show a six-transistor, four-level, flying capacitor converter, but the principles discussed can be applied to other configurations of flying capacitor converters which implement an even number of voltage levels (e.g., a two-transistor, two-level converter; a ten-transistor, six-level converter; etc.).

Figure 1:
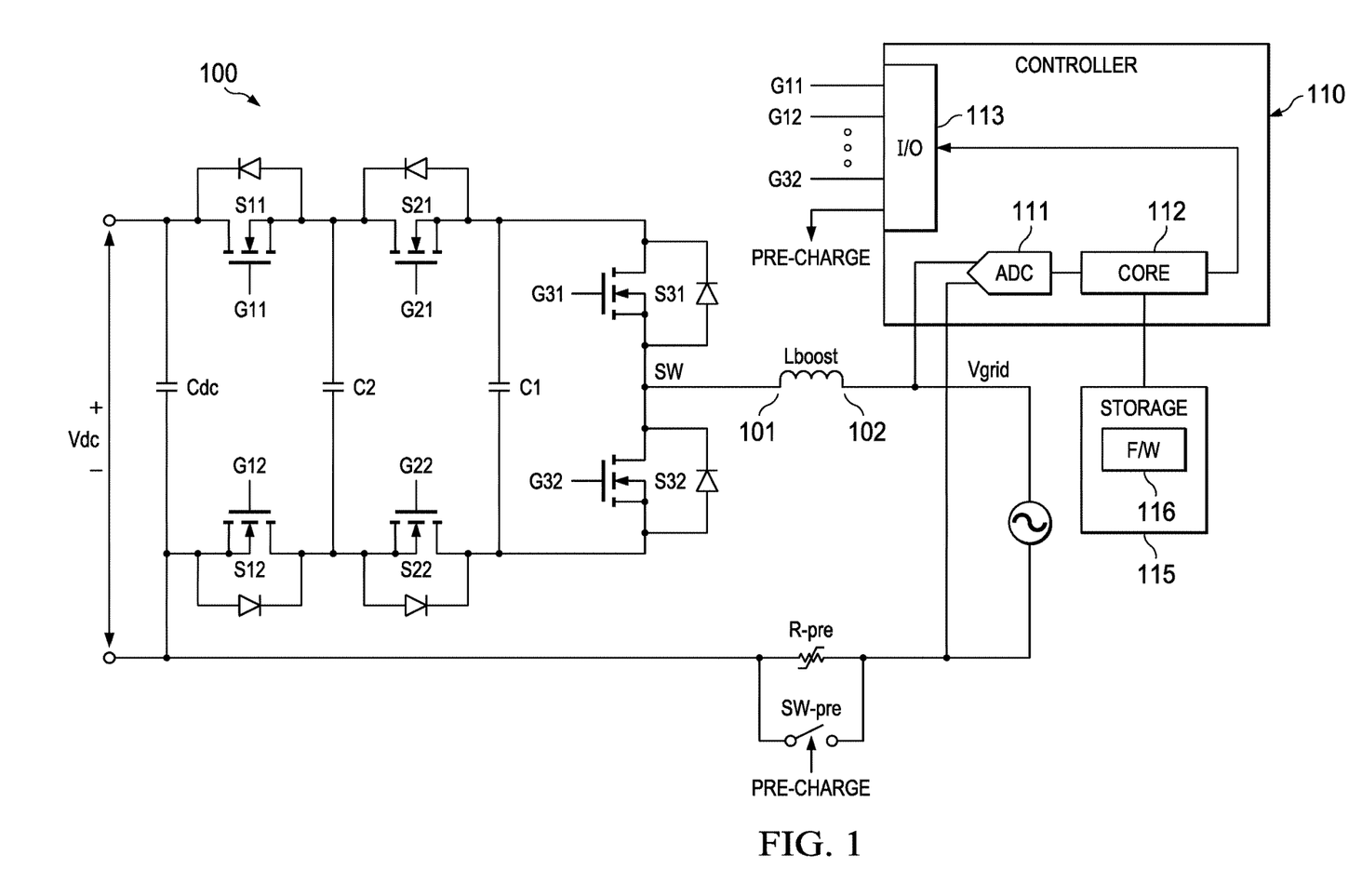
FIG. 1 is a schematic of a six-transistor, four-level, flying capacitor converter in accordance with an example.

FIG. 1 is a schematic of a six-transistor, four-level, flying capacitor converter 100. The input to the converter is an AC voltage, which in this example, is the AC mains voltage, labeled Vgrid in FIG. 1. The converter 100 converts the input AC voltage to a DC output voltage, shown as the voltage Vdc across capacitor Cdc. The converter 100 includes transistors S11, S12, S21, S22, S31, and S32, capacitors C1, C2, and Cdc, inductor Lboost, resistor Rpre-charge, switch SW-pre, and controller 110.

The transistors in this example are N-type metal oxide semiconductor field effect transistors and are operated as switches (on or off). The source of transistor S31 is coupled to the drain of transistor S32 at a switch node SW. Capacitor C1 is coupled to the drain of transistor S31 and to the source of transistor S32. Accordingly, capacitor C1 is coupled in parallel with the series coupling of transistors S31 and S32. The source of transistor S21 is coupled to capacitor C1 and to the drain of transistor S31. The drain of transistor S22 is coupled to capacitor C1 and to the source of transistor S32. Capacitor C2 is coupled to the drain of transistor S21 and to the source of transistor S22. Accordingly, capacitor C2 is coupled across transistors S21 and S22. The source of transistor S11 is coupled to capacitor C2 and to the drain of transistor S21. The drain of transistor S12 is coupled to capacitor C2 and to the source of transistor S22. Capacitor Cdc is coupled to the drain of transistor S11 and to the source of transistor S12. Accordingly, capacitor Cdc is coupled across transistors S11 and S12.

Each transistor has a control input (e.g., a gate). Each gate receives a control signal generated by the controller 110. The gate signal for transistor S11 is labeled G11. Similarly, the gate signals for transistors S12, S21, S22, S31, and S32 are labeled G12, G21, G22, G31, and G32, respectively, as shown in FIG. 1.

One terminal 101 of inductor Lboost is coupled to the switch node SW. The opposing terminal 102 of inductor Lboost is coupled to the AC input voltage Vgrid. The resistor R-pre is coupled between the AC input voltage Vgrid and capacitor Cdc. Switch SW-pre is coupled across resistor R-pre. The controller 100 generates a control signal PRE_CHARGE to open and close switch SW-pre. The controller asserts the control signal PRE_CHARGE to a first logic state (e.g., logic low) to cause switch SW-pre to be open during a pre-charge mode of operation in which the voltage on capacitors C1, C2, and Cdc are increased from 0 V upon a power-on event to their final steady state voltage in a controlled manner as described herein. Including the resistance of the resistor R-pre during the pre-charge mode advantageously limits the current through capacitor Cdc when the voltage across capacitor Cdc is lower than the instantaneous voltage of Vgrid. Resistor R-pre may have a fixed resistance or may be implemented to have a negative temperature coefficient (e.g., its resistance may vary inversely with temperature). Upon completing the pre-charge mode, the controller asserts the control signal PRE_CHARGE to a second logic state (e.g., logic high) to cause switch SW-pre to be closed thereby bypassing the resistor R-pre.

In the example of FIG. 1, the controller 100 includes an analog-to-digital converter (ADC) 111 coupled to a processing core 112. A non-transitory storage device 115 contains executable machine instructions (e.g., firmware 116). Non-transitory storage device 115 may be separate from, or contained within, controller 100. Firmware 116 is provided to and executed by the core 112. In one embodiment, the pre-charge technique described herein is performed by the core 112 executing firmware 116. The core 112 causes gate signals G11-G32 to be asserted to turn on and off the transistors S31-S32 as described herein. In the example of FIG. 1, controller 100 is a programmable processor that executes machine instructions. In other embodiments, controller 100 is a discrete circuit (e.g., a finite state machine).

Figure 2:
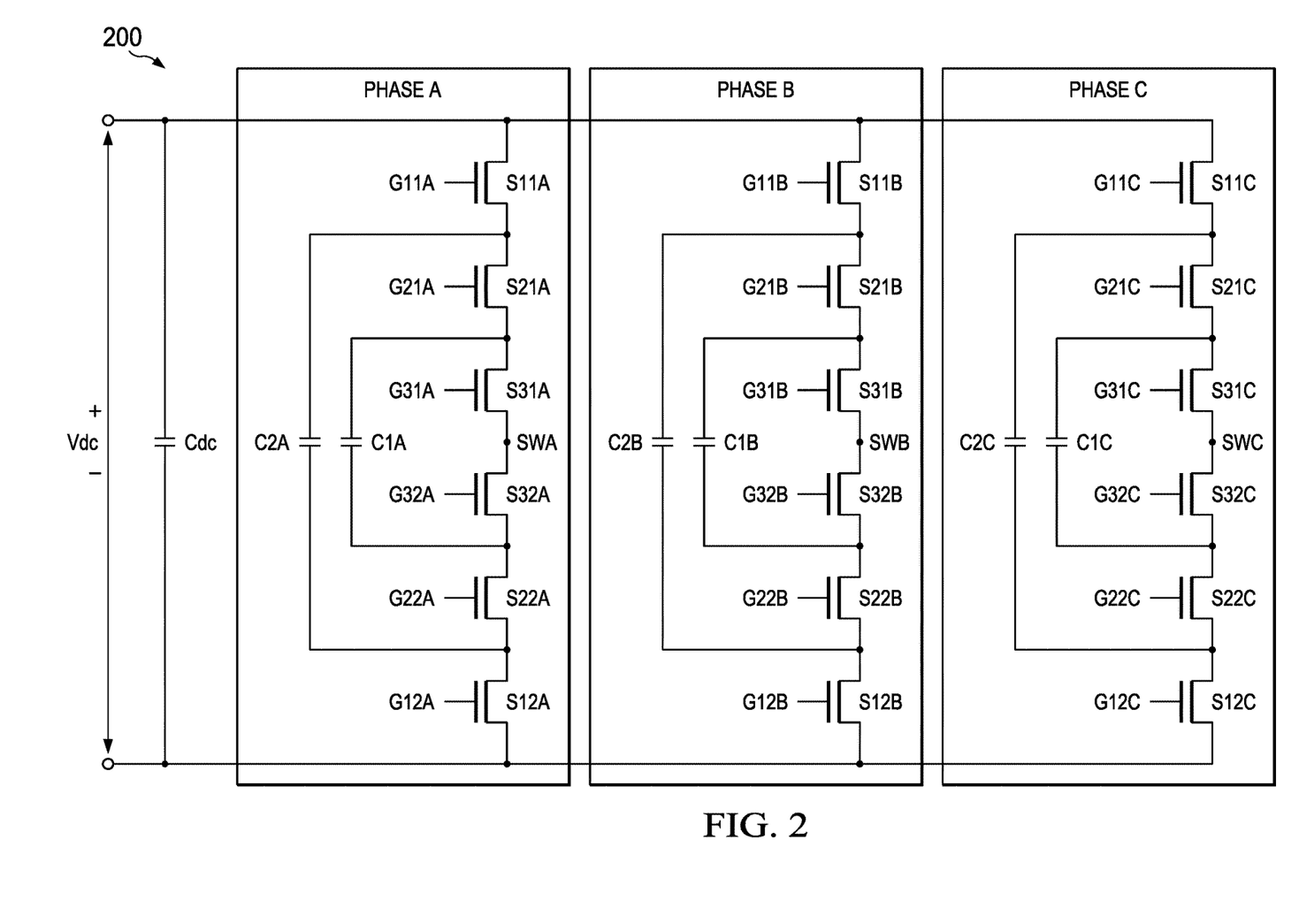
FIG. 2 is a schematic containing the capacitors and transistors for each of three phases of a four-level, flying capacitor converter in accordance with an example.

The converter 100 can be coupled to a single-phase AC input voltage or a three-phase AC input voltage. FIG. 1 shows a single-phase implementation for converter 100. FIG. 2 shows a three-phase implementation. FIG. 2 shows the capacitors and transistors for each of the three phases Phase A, Phase B, and Phase C of a four-level, flying capacitor converter 200. While not shown for simplicity reasons, switch nodes SWA, SWB, and SWC of phases A-C, respectively, are coupled to respective grid voltages Vgrida, Vgridb, and Vgridc through separate boost inductors. Other components such as the resistor R-pre and switch SW-pre are not shown in FIG. 2 for simplicity.

The configuration of each of the phases Phase A, Phase B, and Phase C is largely the same as is shown in FIG. 1. The transistors within each phase are shown vertically, but the connections between the transistors and the corresponding capacitors is identical to that shown and described above regarding FIG. 1. The components are numbered the same as in FIG. 1 with the components of Phase A having a terminal letter "A", the components of Phase B having a terminal letter "B," and the components of Phase C having a terminal letter "C."

Within Phase A, capacitor C1A is coupled across transistors S31A and S32A, and capacitor C2A is coupled across transistors S21A and S22A. Similarly, within Phase B capacitor C1B is coupled across transistors S31B and S32B, and capacitor C2B is coupled across transistors S21B and S22B. Within Phase C capacitor C1C is coupled across transistors S31C and S32C, and capacitor C2C is coupled across transistors S21C and S22C. A single capacitor Cdc is coupled to and shared by all three phases Phase A, B, and C.

The gate signals transistors for transistors S11A, S12A, S21A, S22A, S32A, and S32A in Phase A are labeled G11A, G12A, G21A, G22A, G32A, and G32A, respectively. The gate signals transistors for transistors S11B, S12B, S21B, S22B, S32B, and S32B in Phase B are labeled G11B, G12B, G21B, G22B, G32B, and G32B, respectively. The gate signals transistors for transistors S11C, S12C, S21C, S22C, S32C, and S32C in Phase C are labeled G11C, G12C, G21C, G22C, G32C, and G32C, respectively. The controller 110 generates gate signals that controls the on and off state of all 18 transistors in this example.

Whether the converter is a single-phase converter (FIG. 1) or a three-phase converter (FIG. 2), the six transistors within a given phase are operated reciprocally in pairs. That is, when the controller turns on one transistor of a given pair is on, the controller turns off the other transistor of that pair. For example, referring to FIG. 2, within Phase A transistors S11A and S12A represent one reciprocal pair, transistors S21A and S22A are another pair, and transistors S31A and S32A are yet another pair. This means that the controller turns on one of transistors S11A and S12A and turns off the other transistor of that pair. The controller does not turn on both transistors of the same pair at the same time.

Reference is made herein to "duty cycle." The term duty cycle means the percentage of time that one of the transistors within the converter is on relative to the time that is off. By way of an example, at a duty cycle of 0.50, a transistor is on for one-half of each switching period and off for the other half of the switching period. At a duty cycle of 0.75, a transistor is on for three-fourths each switching period and off for the other one-quarter of the switching period. The controller 110 implements a switching frequency that is substantially higher than the frequency of the AC input voltage. In one example, the controller 110 implements a switching frequency at 140 kHz and the frequency of the AC input voltage is 50 Hz, 60 Hz, or whatever frequency characterizes the mains voltage in any particular country. The switching period referred to above is 1/(switching frequency).

Given that only transistor of each pair (e.g., S11A/S12A, S21A/S22A, and S31A/S32A are on at any point in time, the reference to duty cycle values in this document refers to the transistors between the switch node and the positive Vdc voltage. Such transistors include transistors S31A, S21A, and S11A in Phase A, transistors S31B, S21B, and S11B in Phase B, and transistors S31C, S21C, and S11C in Phase C. For example, if transistor S31A has a duty cycle of D, transistor S32A has a duty cycle of (1-D).

Figure 3:
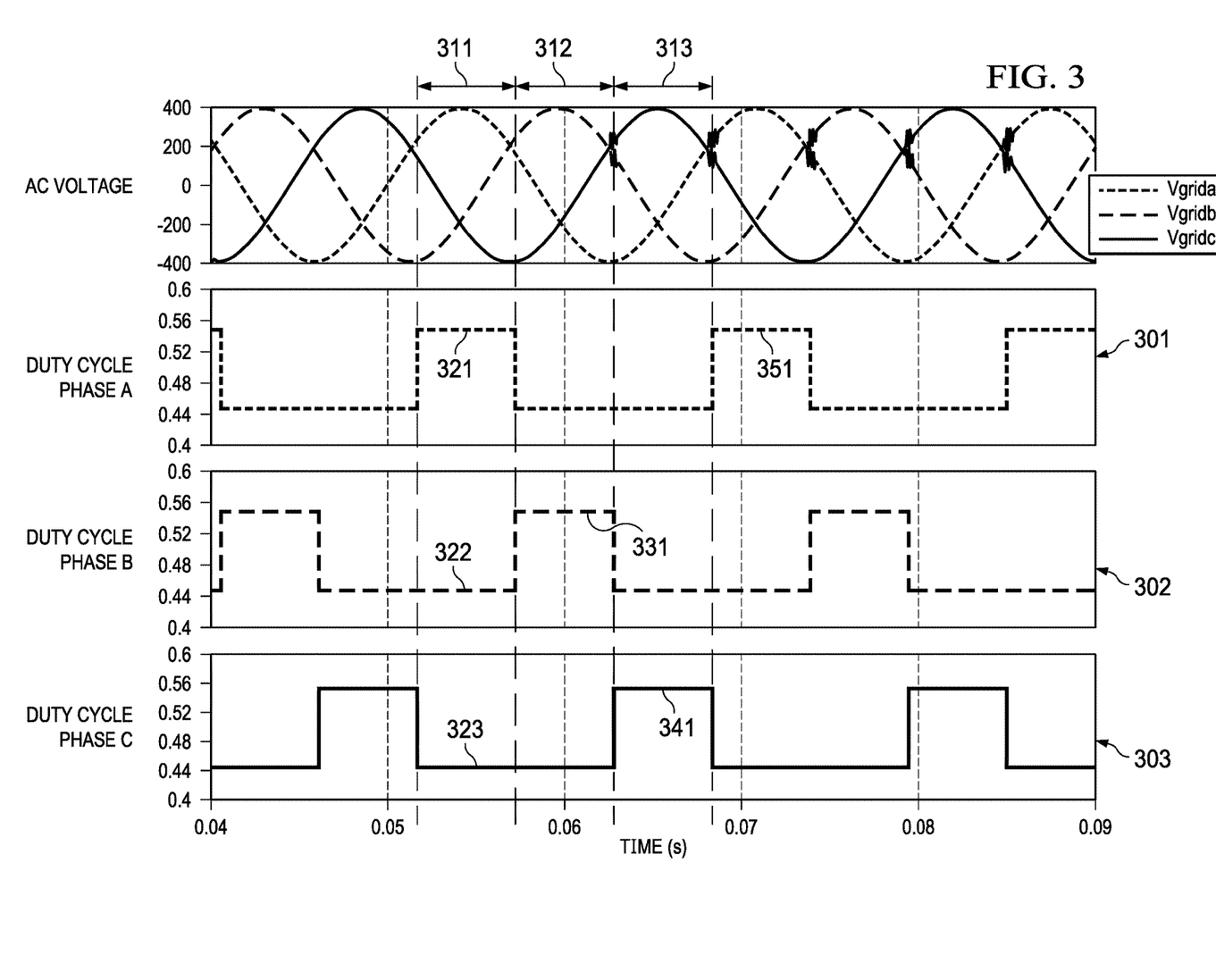
FIG. 3 shows waveforms pertaining to one embodiment for how the converter's controller time-varies the duty cycle of the converter's transistors.

During the pre-charge mode of the converter 100 (single-phase) or 200 (three-phase), the controller 110 varies the duty cycle of the transistors with respect to time. FIG. 3 shows an example of one embodiment for how the controller time-varies the duty cycle. FIG. 2 shows waveforms for the three-phase AC input voltage. The three-phase AC voltage is Vgrida, Vgridb, and Vgridc. Each waveform is sinusoidal ranging, in this example, from +400V to −400V. The AC waveforms are 120 degrees out of phase with respect to each other.

Waveforms 301, 302, and 303 are the duty cycle of Phase A, Phase B, and Phase C, respectively, of the converter. For each of the phases of the converter, the duty cycle switches between two duty cycle levels, D1 and D2. In the example of FIG. 3, D1 is 0.55 and D2 is 0.45, but D1 and D2 can be other than 0.55 and 0.45 in other examples. D1 can be any number from above 0.5 to below 1, and D2 is the 1-D1. The magnitude of D1 can be used to tune the pre-charging speed based on the specific system parameters—a smaller value of D1 increases the speed at which pre-charging occurs (pre-charging completes in less time), and a larger value of D1 decreases the pre-charging speed.

The controller 110 configures the duty cycle for a particular phase when the AC voltage of that phase is greater than the AC of both of the other phases. For example, during time period 311, the voltage of Vgrida is larger than the voltage of Vgridb and also larger than the voltage of Vgridc. The controller 110 receives converts each AC voltage to digital values using an ADC (e.g., the ADC 111 in FIG. 1) and the core 112 compares the digital values corresponding to the AC voltages to determine which voltage is higher. Accordingly, the controller 110 determines that Vgrida is largest during time period 311 and, accordingly, operates the switches in Phase A at a duty cycle of 0.55 as shown at 321.

During time period 311, because the controller 110 determines that the voltages of Vgridb and Vgridc are smaller than the voltage of Vgrida, the controller 110 operates the switches of Phase B and Phase C at 0.45 as shown at 322 and 323. During time period 312, the controller 110 determines that the voltage of Vgridb is the largest of the three AC voltage waveforms and accordingly operates the transistors of Phase B at a duty cycle of 0.55 (identified at 331) and the transistors of Phases A and C at 0.45. Similarly, during time period 313, the controller 110 determines that the voltage of Vgridc is the largest of the three AC voltage waveforms and accordingly operates the transistors of Phase C at a duty cycle of 0.55, as shown at 341, and the transistors of Phases A and B at 0.45. Each time period 311-313 corresponds to 120 degrees of the AC waveforms. The process repeats with the controller 110 again operating the switches of Phase A at a duty cycle of 0.55 as shown at 351, and so on.

FIG. 1 shows that the controller 110 generates the gate signals for the transistors S11, S12, S21, S22, S31, and S32 (and, in the case, of a three-phase converter, the gate signals for the transistors of all three phases). However, in some embodiments, multiple (e.g., two) transistors share one isolated gate supply through a bootstrap circuit.

Figure 4:
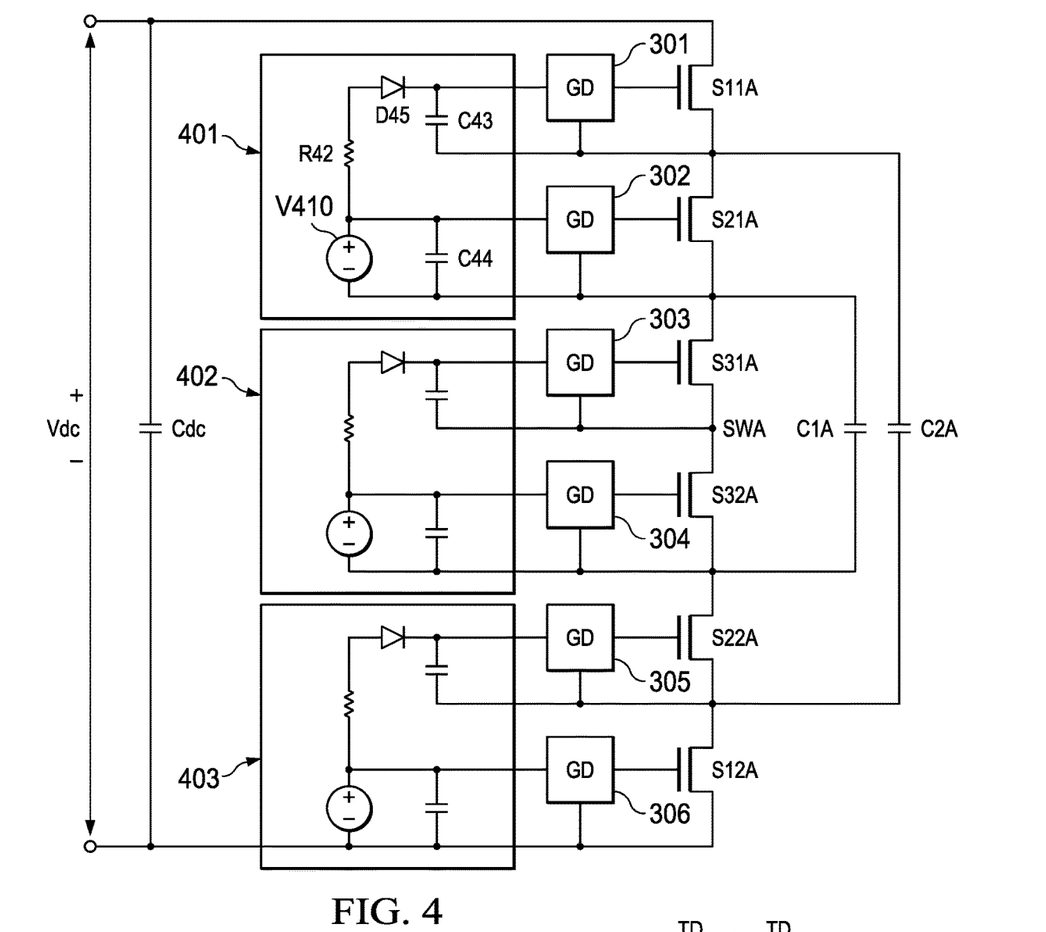
FIG. 4 is a schematic in which three bootstrap gate supplies are coupled to the respective gate driver of each of the respective six transistors of one phase of a three-phase, four-level flying capacitor converter in accordance with an example.

FIG. 4 is a schematic in which a separate gate driver (GD) 301-306 is coupled to the gate of each of the respective transistors of Phase A (transistors S11A, S21A, S31A, S32A, S22A, and S12A). Each gate driver receives a respective gate signal (not shown in FIG. 4). For example, gate driver 301 receives gate signal G11A. FIG. 4 also shows that pairs of gate drivers share a bootstrap circuit. For example, gate drivers GD301 and GD302 (and their respective transistors S11A and S21A) share a bootstrap circuit 401. Gate drivers GD303 and GD304 (and their respective transistors S31A and S32A) share a bootstrap circuit 402, and gate drivers GD305 and GD306 (and their respective transistors S22A and S12A) share a bootstrap circuit 403. Each bootstrap circuit includes a voltage source, a resistor, a diode, and a capacitor. For example, bootstrap circuit 401 includes a voltage source V410, a resistor R42, capacitors C43 and C44, and diode D45.

At power-on, gate drivers GD 302, 304 and 306 are directly supplied by the isolated gate supply represented as the voltage sources in the bootstrap circuits 401, 402, and 403 (e.g., voltage source V410). To provide a supply voltage to gate drivers GD 301, 303 and 305, transistors S21A, S32A and S12A are turned on. By turning on transistors S21A, S32A, and S12A, the voltage sources can supply a voltage through the respective resistors and diodes to gate drivers GD 301, 303, and 305. For example, by turning on transistor S21A, the isolated voltage source V410 in bootstrap circuit 401 provides a voltage to gate driver GD 301 through resistor R42, diode D45, and transistor S21A, and also charges capacitor C43. When transistor S21A is off, the supply path for gate driver GD 301 is cut off. However, the charge stored in the capacitor C43 continues to provide a voltage to gate driver GD 301 to turn on transistor S11A. Therefore, to supply gate driver GD 301, a constant on and off switching of S21A is required for refreshing the charge on capacitor C43 connected to GD 301. Similarly, transistors S32A and S12A also are switched on and off so as to maintain a sufficient charge on the capacitors coupled across gate drivers GD 303 and GD 305. As is explained herein, during the pre-charge mode, the transistors (e.g., transistors S11A . . . , S12A) are repeatedly toggled on and off with certain duty cycles. Toggling the transistors on and off advantageously permits individual bootstrap circuits to be shared by multiple gate drivers.

To apply the startup method herein to three phase converters, all legs should avoid identical duty cycle at the same time. For example, duty 0.5 provide quick flying capacitor voltage balancing to the flying capacitors. However, by applying it to all three phases, the inverter has equivalently 0 impedance and no energy transfer.

Figure 5:
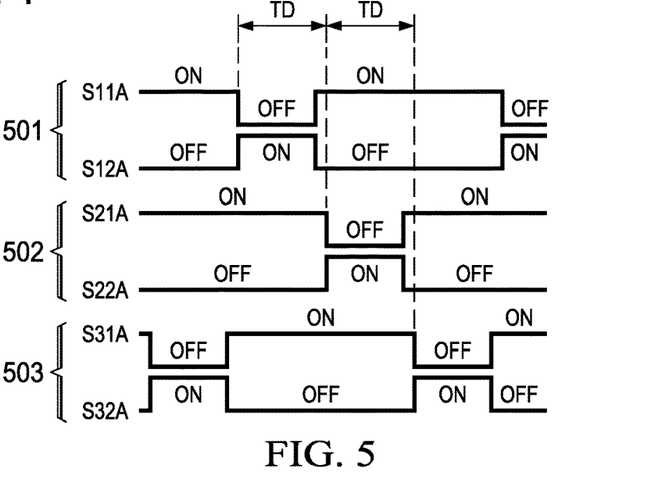
FIG. 5 shows example waveforms that represent the on/off state of the respective transistors of one of the phases of a three-phase flying capacitor converter.

As described above, the duty cycle of the transistors varies during the start-up mode. FIG. 5 illustrates that the controller 110 implements a delay between reciprocal pairs 501, 502, and 503 of transistors for Phase A. Pair 501 includes transistors S11A and S12A. Pair 502 includes transistors S21A and S22A. Pair 503 includes transistors S31A and S32A. The waveforms in FIG. 5 represent the on/off state of the respective transistor. For pair 501, when the controller turns on transistor 511A, the controller turns off transistor S12A, and the controller turns on transistor S12A when the controller turns off transistor S11A. Similarly, the waveforms show that the controller turns off transistor S22A when it turns on transistor S21A, and vice versa, and that the controller turns off transistor S32A when it turns on transistor S31A, and vice versa.

FIG. 5 also shows that the controller 110 changes the on/off state of the transistors S21A and S22A of pair 502 at a time delay TD following the controller changing the on/off state of the transistors S11A and S12A of pair 501. Similarly, the controller 110 changes the on/off state of the transistors of pair 503 at the same time delay TD following the controller changing the on/off state of pair 502. The duty cycle of transistors S11A, S21A, and S31A is the same (e.g., toggling between 0.55 and 0.45 as in the example of FIG. 3).

For the other phases—Phases B and C—the controller 110 controls the on and off state of those transistors in much the same as shown in FIG. 5 and with the same timing. For example, the controller turns on and off transistors S11B and S11C at the same time as is shown in FIG. 5 for transistor S11A.

Figure 6:
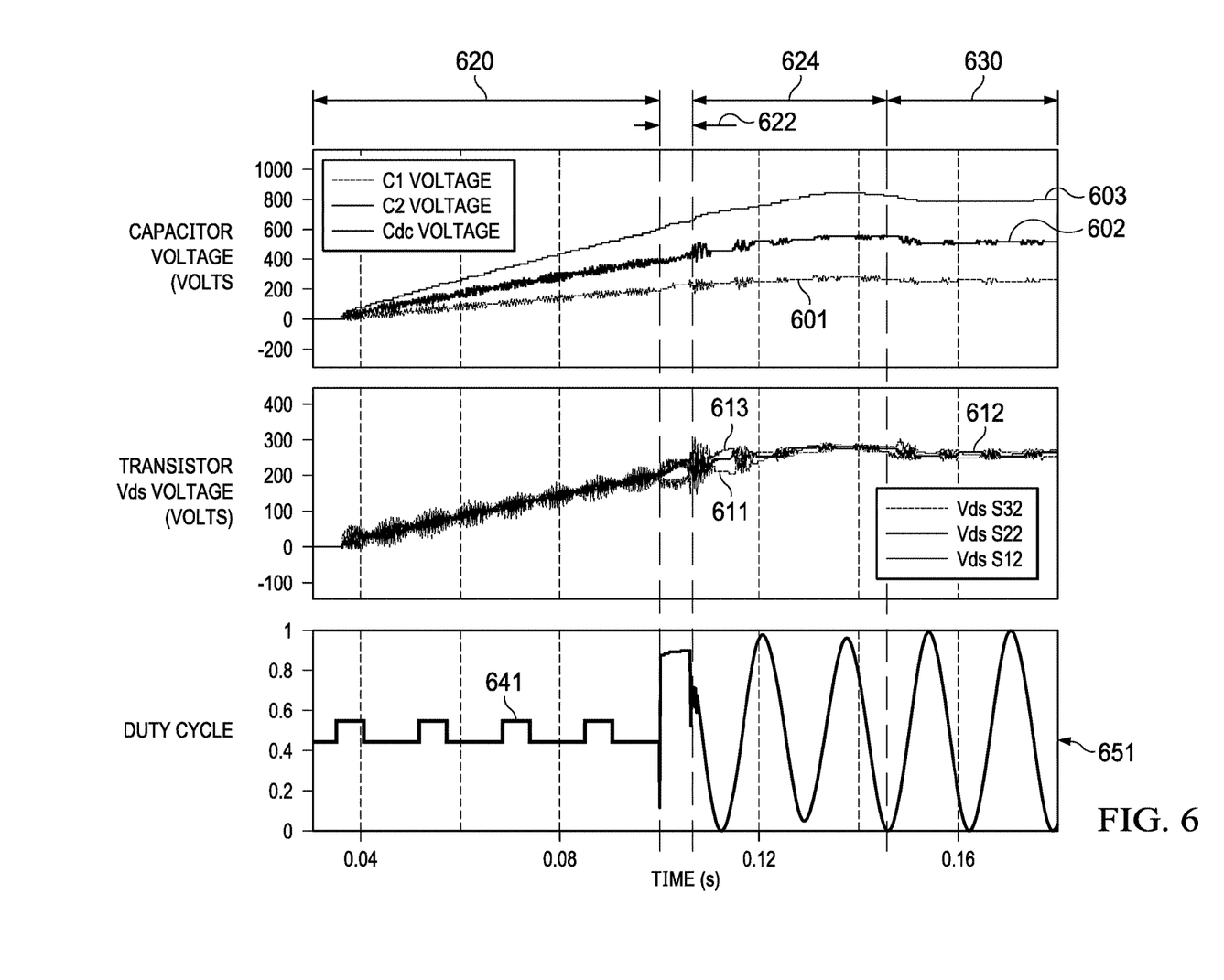
FIG. 6 shows example waveforms illustrating voltages within a flying capacitor converter as well as the variable duty cycle of the transistors during the pre-charge mode and during normal operation in accordance with an example.

FIG. 6 shows waveforms illustrating examples of voltages within the converter 100, 200 as well as the variable duty cycle of the transistors during the pre-charge mode 620 and during normal operation 630. The illustrative voltage waveforms include the voltages of capacitors C1 (waveform 601), capacitor C2 (waveform 602), and capacitor Cdc (waveform 603), the device voltage stress (Vds) of transistors S31 and S32 (waveform 611), S21 and S22 (waveform 612), and S11 and S12 (waveform 613), and the duty cycle of the transistors within the converter.

The duty cycle waveform includes a portion 641 which illustrates the changing of the duty cycle from a higher level (e.g., 0.55) to a lower level (e.g., 0.45) during the pre-charge mode 620. During the normal operation (630), the controller 110 varies the duty cycle of the transistors in a sinusoidal fashion as illustrated at 651. Thus, during a first mode (e.g., the pre-charge mode 620) and in accordance with a first time-varying duty cycle, the controller 110 turns on and off a first transistor of each reciprocal pair and then turns on the second transistor of the pair while turning off the first transistor. During a second mode (e.g., the normal operational mode) following the first mode, and in accordance with a second, time-varying duty cycle, the controller 110 turns on and off the first transistor while turning on (or off) the second transistor when the first transistor is off (or on).

The controller 110 discontinues the pre-charge mode upon detecting that the voltage on capacitor Cdc has reached a threshold (e.g., 80% of its final value). During time period 622, the inverter charges up the DC bus (the voltage Vdc across capacitor Cdc) from the end of pre-charge to its nominal value slowly and smoothly. During time period 624, the voltage Vdc continues to increase up to 100% of its final value while the switch SW-pre remains open and thus with current flowing through resistor R-pre. When the voltage Vdc reaches its nominal value, the controller 110 switches to normal operation in which the controller 110 causes switch SW-pre to be closed thereby causing current to bypass resistor R-pre.

Figure 7:
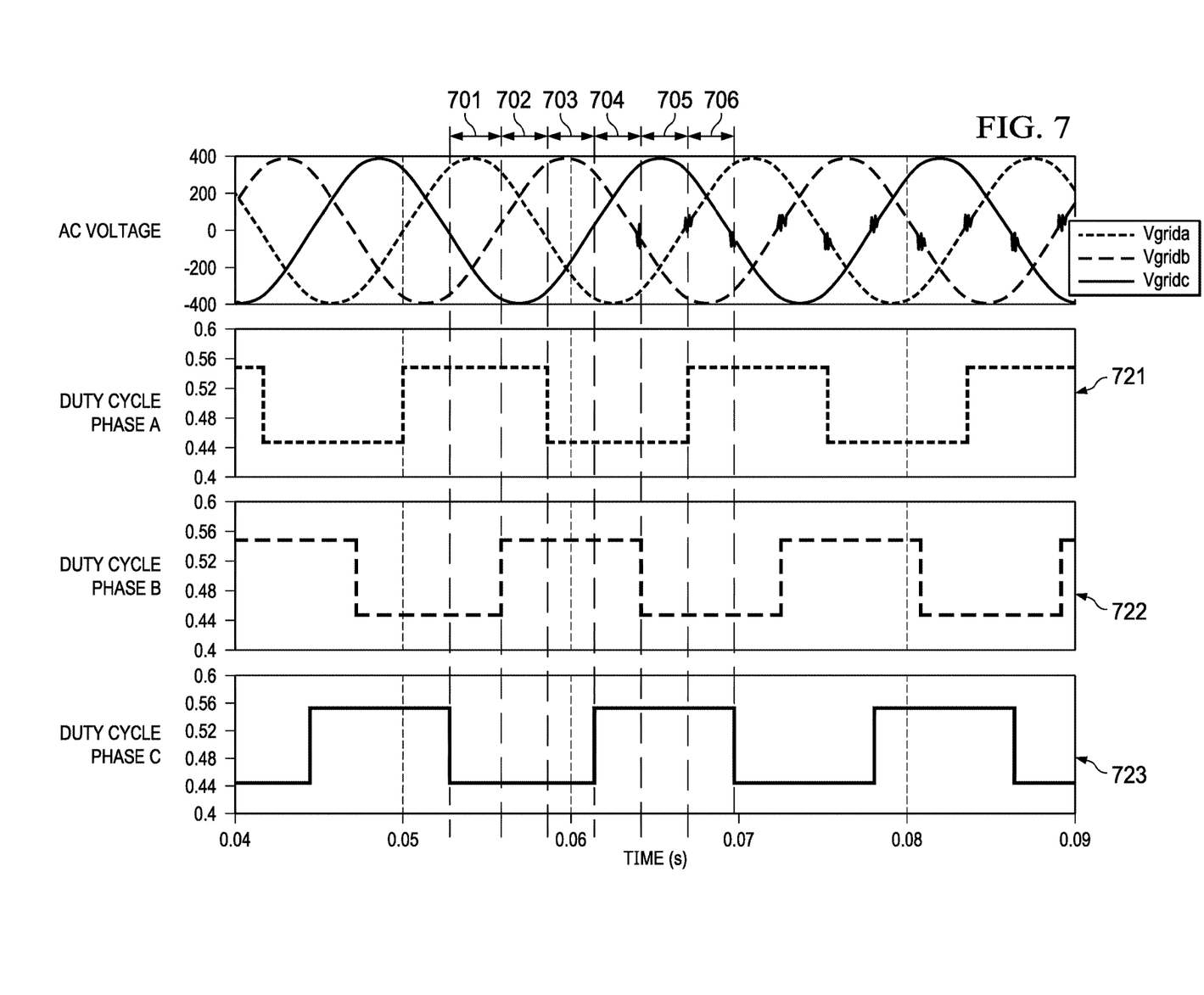
FIG. 7 shows waveforms pertaining to another embodiment for how the converter's controller time-varies the duty cycle of the converter's transistors.

FIG. 7 shows an alternative embodiment of how the duty cycle of the transistors of the converter is controlled. The embodiment of FIG. 7 depicts a six-step duty cycle modulation technique. The period of the AC input voltages (e.g., 1/60 Hz) is divided into six equal time slices (and thus each is 60 degrees wide) 701, 702, 703, 704, 705 and 706. FIG. 7 shows the duty cycle waveforms during the pre-charge mode for Phase A (waveform 721), Phase B (722), and Phase C (723). During each time slice, the controller 110 compares the magnitudes of the three AC grid voltages (Vgrida, Vgridb, and Vridc) to each other and sets the duty cycle of the corresponding phases (Phase A, Phase B, and Phase) as follows:

Set duty cycle to the higher level (e.g., 0.55) for the phase with largest positive voltage (and the duty cycle of the other two phases set to the lower level (e.g., 0.45);

Set duty cycle to the lower level (e.g., 0.45) for the phase with largest negative voltage (and the duty cycle of the other two phases set to the higher level (e.g., 0.55);

Applying these rules to the example AC grid waveforms in FIG. 7, for each of the six time slices, the controller 110 sets the duty cycle of the transistors of the three phases as follows (the duty cycle values are examples, and can be different from that listed):

Time slice 701: Vgrida is a more positive voltage than both of Vridb and Vridc, and thus the duty cycle for the Phase A transistors are set to 0.55 and the duty cycle of the Phase B and Phase C transistors are set to 0.45.

Time slice 702: Vgridc is a more negative voltage than both of Vrida and Vridb, and thus the duty cycle for the Phase C transistors are set to 0.45 and the duty cycle of the Phase A and Phase B transistors are set to 0.55;

Time slice 703: Vgridb is a more positive voltage than both of Vrida and Vridc, and thus the duty cycle for the Phase B transistors are set to 0.55 and the duty cycle of the Phase A and Phase C transistors are set to 0.45;

Time slice 704: Vgrida is a more negative voltage than both of Vridb and Vridc, and thus the duty cycle for the Phase A transistors are set to 0.45 and the duty cycle of the Phase B and Phase C transistors are set to 0.55;

Time slice 705: Vgridc is a more positive voltage than both of Vrida and Vridb, and thus the duty cycle for the Phase C transistors are set to 0.55 and the duty cycle of the Phase A and Phase B transistors are set to 0.45;

Time slice 706: Vgridb is a more negative voltage than both of Vrida and Vridc, and thus the duty cycle for the Phase B transistors are aet to 0.45 and the duty cycle of the Phase A and Phase C transistors are set to 0.55.

Figure 8:
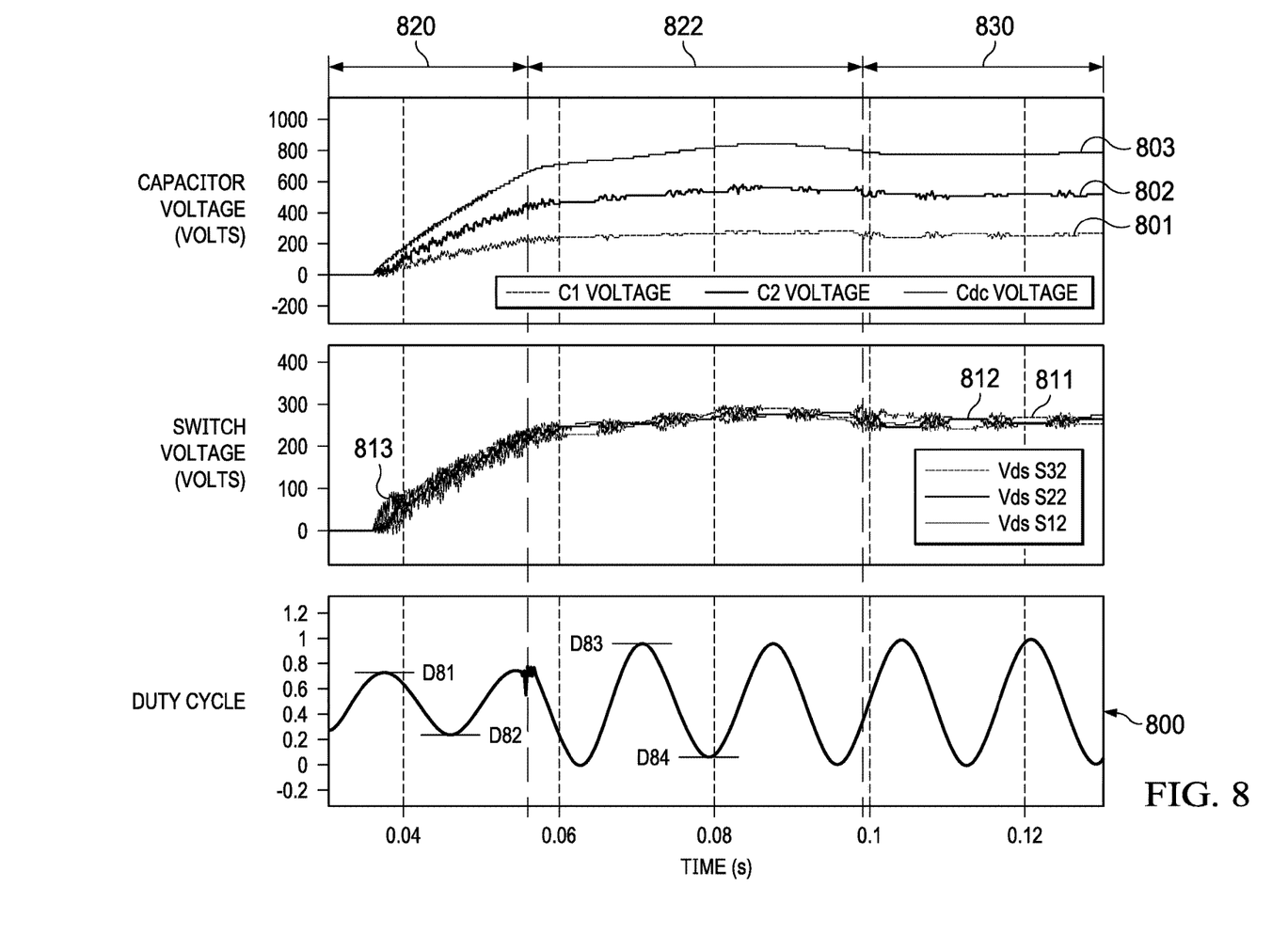
FIG. 8 illustrates another embodiment for time-varying the duty cycle of the transistors in the converter during a pre-charge mode in which the duty cycle is varied sinusoidally but at a lower amplitude than during normal operation.

FIG. 8 illustrates another embodiment for time-varying the duty cycle of the transistors in the converter during a pre-charge mode. Waveform 800 shows the duty cycle of the transistors during the pre-charge mode 820 and during normal operation 830. During both the pre-charge mode 820 and normal operation 830, the controller 110 varies the duty cycle sinusoidally. However, the range of duty cycles is smaller during the pre-charge mode 820 than during normal operation 830. The controller 110 varies the duty cycle during the pre-charge mode from a higher level of D81 to a lower level of D82, and during normal operation, the controller 110 varies the duty cycle from a higher level of D83 to a lower level of D84. In the example of FIG. 8, D81 and D82 are 0.75 and 0.25, respectively, and D83 and D84 are 1 and 0, respectively. The values of D81-D84 can be different from that shown in FIG. 8. For example, D81 can be smaller than 0.75 (e.g., 0.7) and D82 can be larger (e.g., 0.3). The controller 110 terminates the pre-charge mode upon determining that the voltage on capacitor Cdc reaches a threshold, which in one embodiment is 80% of its final voltage value. During time period 822, switch SW-pre remains open thereby causing current to flow through resistor R-pre. After voltage Vdc reaches its nominal value, the controller 110 causes switch SW-pre to close thereby bypassing resistor R-pre.

Waveforms 801, 802, and 803 show the voltage on capacitors C1, C2, and Cdc, respectively. Comparing waveforms 801-803 to waveforms 601-603 (FIG. 6) shows that the capacitors (including capacitor Cdc) charge faster if the duty cycle modulation technique for the pre-charge mode represented in FIG. 8 is used instead of the repeated stepwise change in duty cycle represented in FIG. 6.

The illustrative voltage waveforms in FIG. 8 also include the Vds device voltage stresses of transistors S31 and S32 (waveform 811), S21 and S22 (waveform 812), and S11 and S12 (waveform 813). The device voltage stresses are closely matched between different pairs of switching during the transition.

Figure 9:
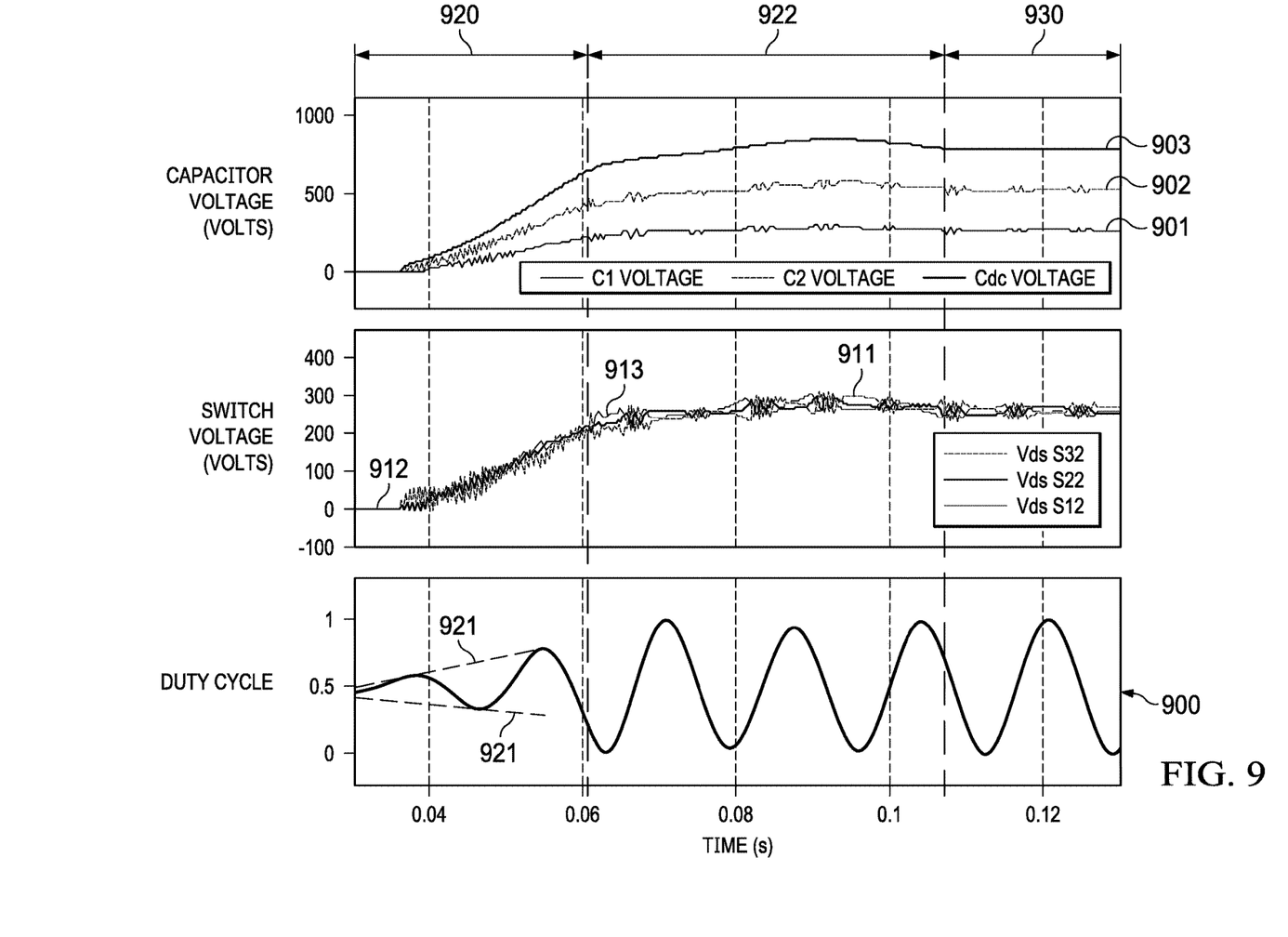
FIG. 9 illustrates yet another embodiment for time-varying the duty cycle of the transistors in the converter during a pre-charge mode in which the duty cycle is varied sinusoidally with an increasing amplitude.

FIG. 9 illustrates yet another embodiment for time-varying the duty cycle of the transistors in the converter during a pre-charge mode. Waveform 900 shows the duty cycle of the transistors during the pre-charge mode 920 and during normal operation 930. During both the pre-charge mode 920 and normal operation 930, the controller 110 varies the duty cycle sinusoidally. However, the magnitude of the sinusoidal waveform during the pre-charge mode 920 is increased as illustrated with lines 921. In one implementation, the increase in magnitude during the pre-charge mode 920 is linear, but it can be other than linear in other implementations. During normal operation 930, the magnitude of the sinusoidal duty cycle waveform is constant. The controller 110 terminates the pre-charge mode upon determining that the voltage on capacitor Cdc reaches a threshold, which in one embodiment is 80% of its final voltage value. During time period 922, switch SW-pre remains open thereby causing current to flow through resistor R-pre. After voltage Vdc reaches its nominal value, the controller 110 causes switch SW-pre to close thereby bypassing resistor R-pre.

Waveforms 901, 902, and 903 show the voltage on capacitors C1, C2, and Cdc, respectively. Comparing waveforms 901-903 to waveforms 601-603 (FIG. 6) shows that the capacitors (including capacitor Cdc) charge faster if the duty cycle modulation technique for the pre-charge mode represented in FIG. 9 is used instead of the repeated stepwise change in duty cycle represented in FIG. 6. Compared to FIG. 8, by varying the amplitude of the sinusoidal duty cycle, the charging rate of the flying capacitors can be controlled.

The illustrative voltage waveforms in FIG. 9 also include the Vds voltages stress of transistors S31 and S32 (waveform 911), S21 and S22 (waveform 912), and S11 and S12 (waveform 913). The device voltage stresses are closely matched between different pairs of switching during this faster transition.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon field effect transistor FET ("MOSFET") may be used in place of an n-type MOSFET with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described examples, and other examples are possible within the scope of the claims.

Modifications are possible in the described embodiments, and other embodiments are possible, within the scope of the claims.

What is claimed is:

1. A circuit, comprising:
   a first transistor having a first control input;
   a second transistor having a second control input;
   a capacitor coupled between the first and second transistors; and
   a controller coupled to the first and second control inputs, the controller configured to:
      during a first mode, with a first time-varying duty cycle, toggle on and off the first transistor while toggling off and on the second transistor, such that the second transistor is on when the first transistor is off; and
      during a second mode following the first mode, with a second time-varying duty cycle, toggle on and off the first transistor while toggling off and on the second transistor, such that the second transistor is on when the first transistor is off.

2. The circuit of claim 1, wherein the first mode is a pre-charge mode during which the controller causes a voltage on the capacitor to increase.

3. The circuit of claim 1, wherein the first time-varying duty cycle repeatedly changes between a first duty cycle value and a second duty value, and the second time-varying duty cycle sinusoidally changes.

4. The circuit of claim 1, wherein:
   the first time-varying duty cycle sinusoidally changes from a first lower duty cycle value to a first higher duty cycle value;
   the second time-varying duty cycle sinusoidally changes from a second lower duty cycle value to a second higher duty cycle value; and
   the first lower duty cycle value is larger than the second lower duty cycle value, and the first higher duty cycle value is smaller than the second higher duty cycle value.

5. The circuit of claim 1, wherein:
   the first time-varying duty cycle sinusoidally changes with a first amplitude that increases; and
   the second time-varying duty cycle sinusoidally changes with a second amplitude that is constant.

6. The circuit of claim 1, wherein the circuit is a flying capacitor converter.

7. The circuit of claim 6, wherein the circuit is a three-phase, flying capacitor converter.

8. The circuit of claim 1, further comprising:
   a first gate driver coupled to the first transistor;
   a second gate driver coupled to the second transistor; and
   a bootstrap circuit coupled to the first and second gate drivers.

9. A circuit, comprising:
   a controller configured to:
      during a first mode, with a first time-varying duty cycle, toggle a first control signal to turn on and off a first transistor while toggling a second control signal to turn off and on a second transistor such that the second transistor is on when the first transistor is off; and
      during a second mode following the first mode, with a second time-varying duty cycle, toggle the first control signal to turn on and off the first transistor while toggling the second control signal to turn off and on the second transistor, such that the second transistor is on when the first transistor is off.

10. The circuit of claim 9, wherein the first mode is a pre-charge mode during which the controller causes a voltage on a capacitor to increase.

11. The circuit of claim 10, wherein the controller is configured to: detect whether the voltage on the capacitor has reached a threshold level; and, responsive to detecting that the voltage has reached the threshold level; discontinue the pre-charge mode and initiate the second mode.

12. The circuit of claim 9, wherein the controller is configured to: repeatedly change the first time-varying duty cycle between a first duty cycle value and a second duty value; and to implement the second time-varying duty cycle as a sinusoidally-varying duty cycle.

13. The circuit of claim 12, wherein the first duty cycle value is greater than 0.5, and the second duty cycle value is a difference between 1.0 and the first duty cycle value.

14. The circuit of claim 9, wherein the controller is configured to:
sinusoidally vary the first time-varying duty cycle between a first lower duty cycle value and a first higher duty cycle value; and
sinusoidally vary the second time-varying duty cycle between a second lower duty cycle value and a second higher duty cycle value;
in which the first lower duty cycle value is larger than the second lower duty cycle value, and the first higher duty cycle value is smaller than the second higher duty cycle value.

15. The circuit of claim 9, wherein the controller is configured to:
sinusoidally vary the first time-varying duty cycle to have a first amplitude that increases; and
sinusoidally vary the second time-varying duty cycle to have a second amplitude that is constant.

16. A method, comprising:
during a pre-charge mode of a flying capacitor converter, with a variable duty cycle, toggling on and off a first transistor while toggling off and on a second transistor, such that the second transistor is on when the first transistor is off; and
during the pre-charge mode, varying the duty cycle.

17. The method of claim 16, wherein varying the duty cycle during the pre-charge mode includes switching the duty cycle between a first duty cycle value and a second duty cycle value.

18. The method of claim 17, wherein the first duty cycle value is greater than 0.5, and the second duty cycle value is a difference between 1.0 and the first duty cycle value.

19. The method of claim 16, wherein varying the duty cycle during the pre-charge mode includes sinusoidally varying the duty cycle to have an increasing amplitude.

20. The method of claim 16, wherein varying the duty cycle during the pre-charge mode includes sinusoidally varying the duty cycle to have a first amplitude, and the method further comprises:
detecting whether a voltage on a capacitor has reached a threshold level; and
responsive to detecting that the voltage has reached the threshold level, discontinuing the pre-charge mode and initiating an operational mode in which the duty cycle is sinusoidally varied to have a second amplitude that is larger than the first amplitude.

* * * * *